United States Patent [19]
Kohno

[11] Patent Number: 5,521,505
[45] Date of Patent: May 28, 1996

[54] MR IMAGING APPARATUS

[75] Inventor: Satoru Kohno, Kyoto, Japan

[73] Assignee: Shimadzu Corporation, Kyoto, Japan

[21] Appl. No.: 358,585

[22] Filed: Dec. 13, 1994

[30] Foreign Application Priority Data

Mar. 31, 1994 [JP] Japan ..................... 6-087715

[51] Int. Cl.⁶ .................................................. G01V 3/00
[52] U.S. Cl. .................................. 324/309; 128/653.2
[58] Field of Search ......................... 324/300, 307, 324/309, 310, 311, 312, 313, 314, 318, 319, 320, 322; 128/653.1, 653.2, 653.3

[56] References Cited

U.S. PATENT DOCUMENTS

| 4,748,410 | 5/1988 | Macovski | 324/309 |
| 4,993,075 | 2/1991 | Sekihara | 324/307 |
| 5,270,654 | 12/1993 | Feinberg et al. | 324/309 |
| 5,285,158 | 2/1994 | Mistretta et al. | 324/309 |

FOREIGN PATENT DOCUMENTS

| 344518A1 | 5/1988 | European Pat. Off. . |
| 318212A2 | 5/1989 | European Pat. Off. . |

OTHER PUBLICATIONS

Proceedings of the Society of Magnetic Resonance in Medicine, Twelfth Annual Scientific Meeting, vol. 3, Aug. 14–20, 1993, p. 1233.

Magnetic Resonance in Medicine, vol. 26, No. 2, Aug. 1, 1992, Duluth, MN, pp. 355–360.

Magnetic Resonance in Medicine, vol. 20, No. 2, Aug. 1, 1991, Duluth, MN, pp. 344–349.

"Grase (Gradient–and Spin–Echo) Imaging: A Novel Fast MRI Technique,": Magnetic Resonance in Medicine 20, pp. 344–349, Koichi Oshio et al. Aug. 20, 1991.

*Primary Examiner*—Michael Tokar
*Attorney, Agent, or Firm*—Nikaido, Marmelstein, Murray & Oram

[57] ABSTRACT

An MR imaging apparatus using NMR phenomenon includes a main magnet, a first to a third gradient field coils, a RF coil, a RF emitter, a slice-selecting gradient field pulse generator, a reading gradient field pulse generator, a phase-encoding gradient field pulse generator and a data processor. The phase-encoding gradient field pulse generator effects phase-encoding, such that phase-encoding gradient field pulses have varied strengths to vary integrated phase encode amounts of spin echo signals from a positive (or negative) value through zero to a negative (or positive) value according to an order of generation; to vary, in a reversed direction, integrated phase encode amounts of each group of gradient echo signals having the same place in an order of generation thereof within respective pulse intervals; and to give the integrated phase encode amounts of each group of gradient echo signals greater absolute values than the integrated phase encode amounts of the spin echo signals.

6 Claims, 8 Drawing Sheets

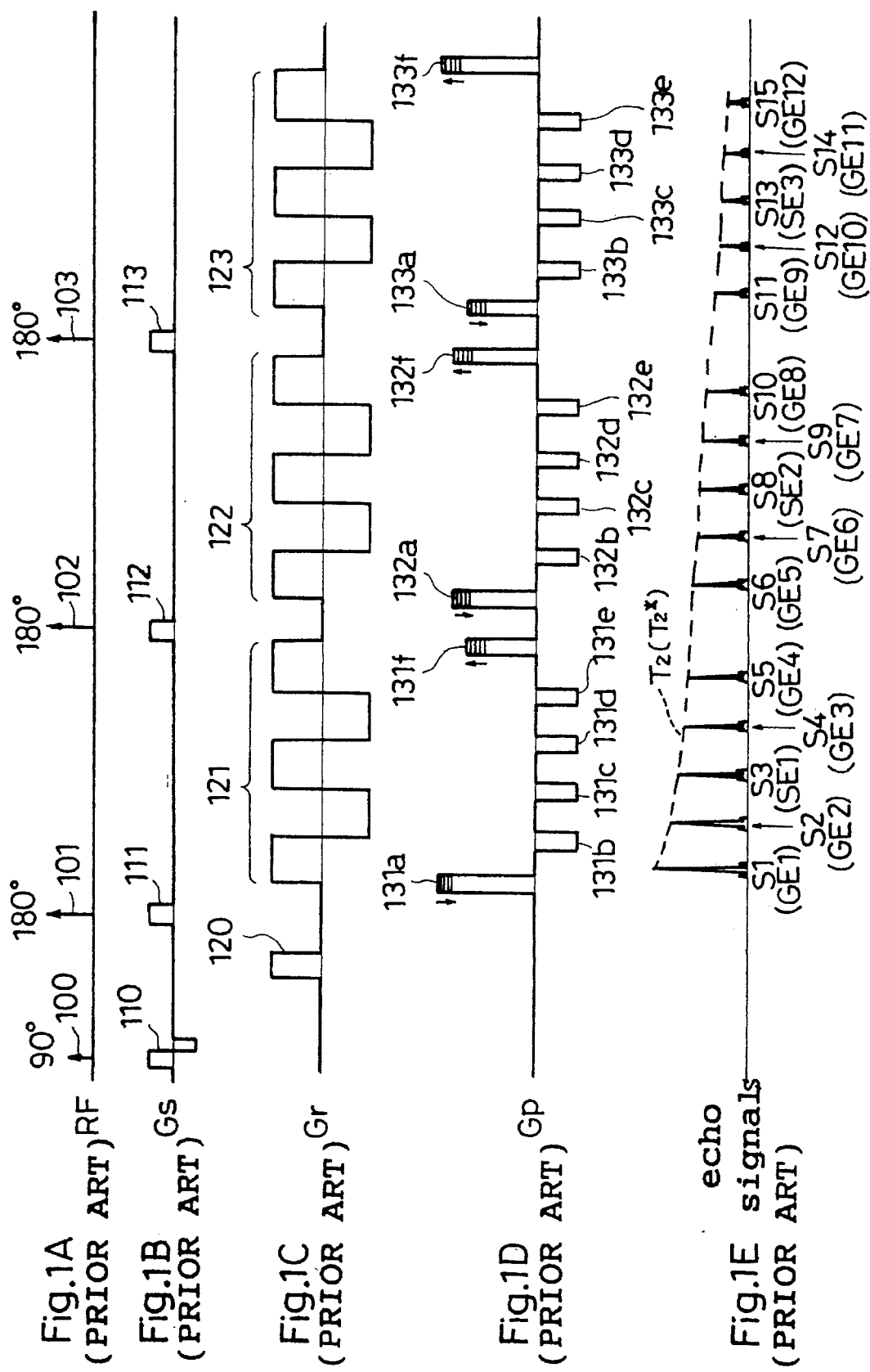

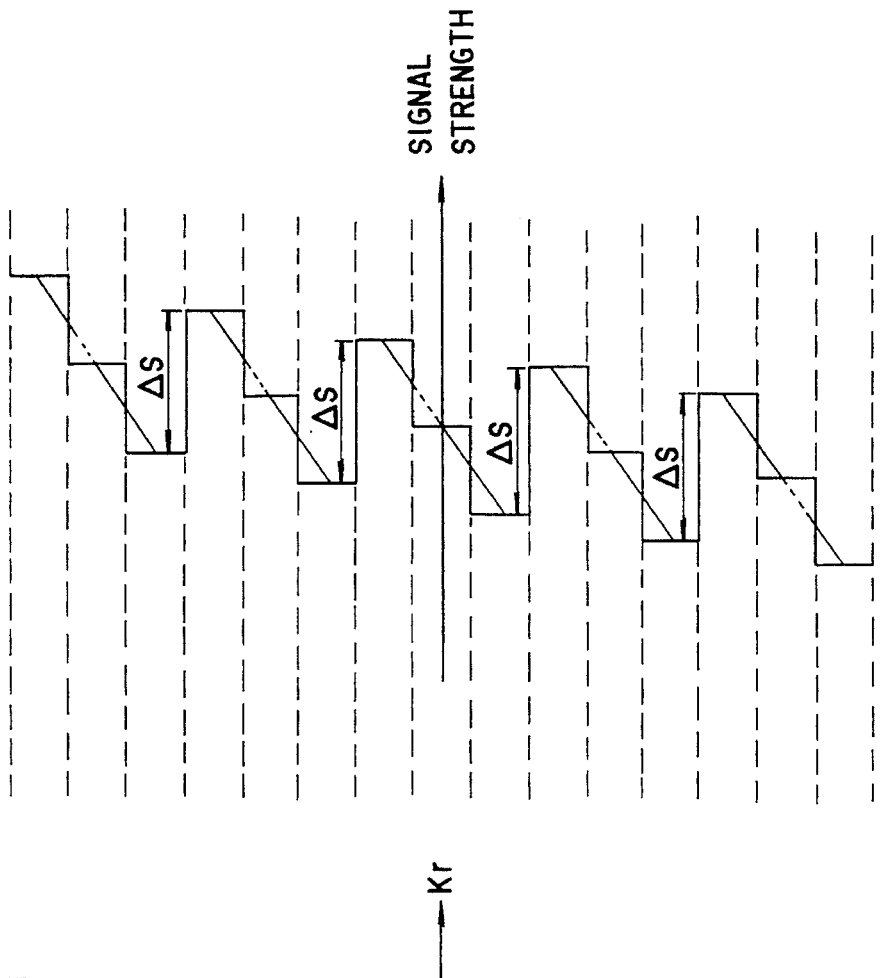
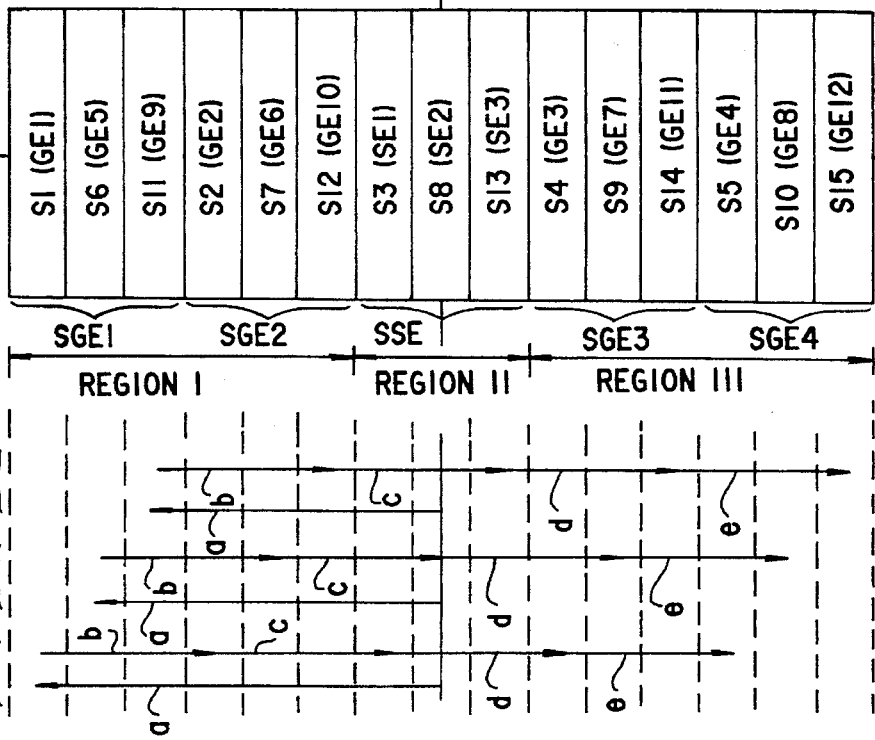

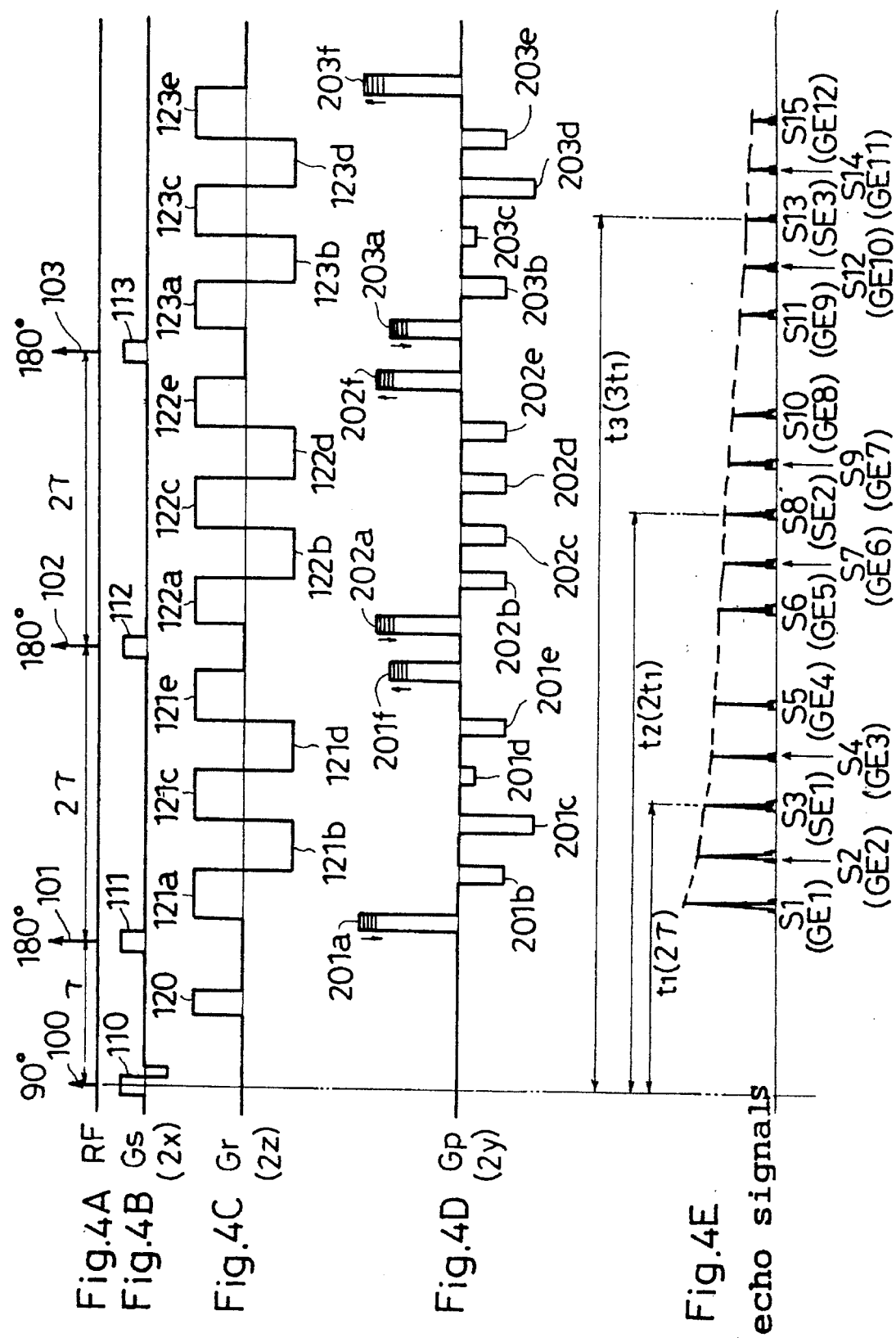

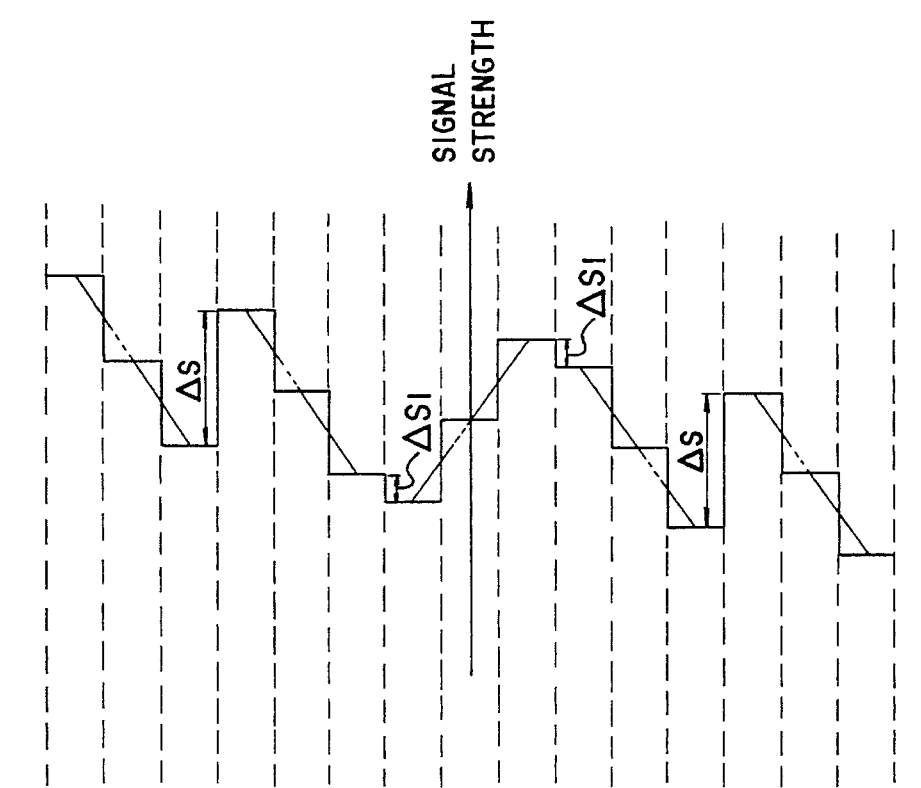
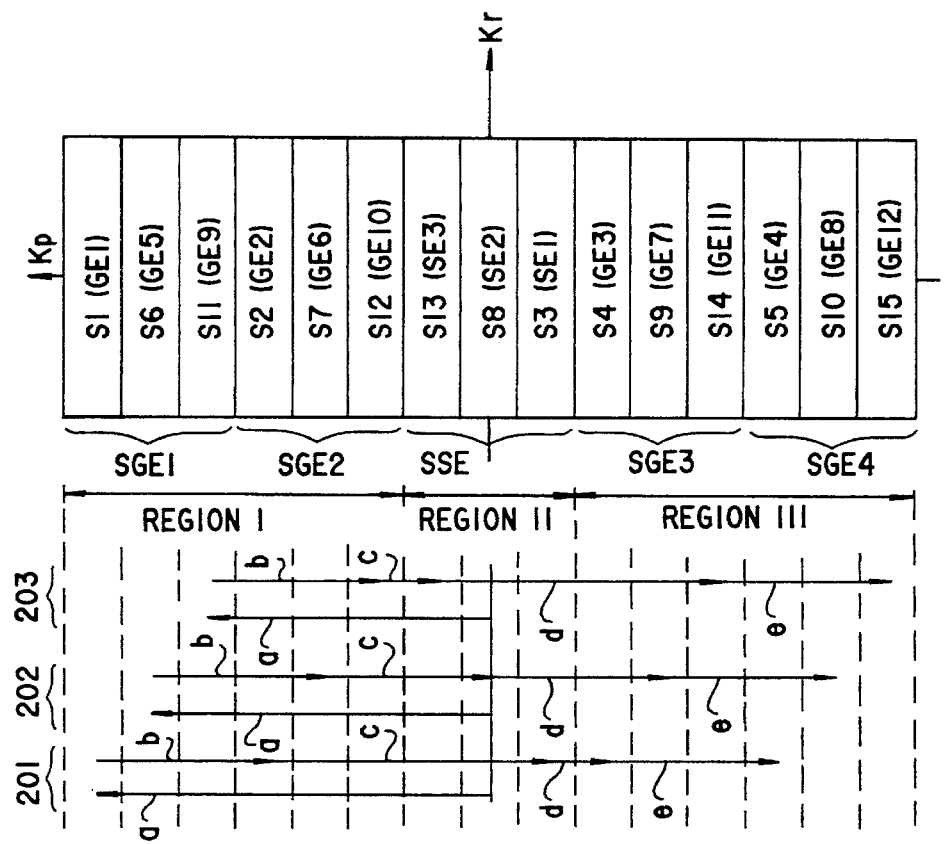
Fig. 5A
Fig. 5B
Fig. 5C

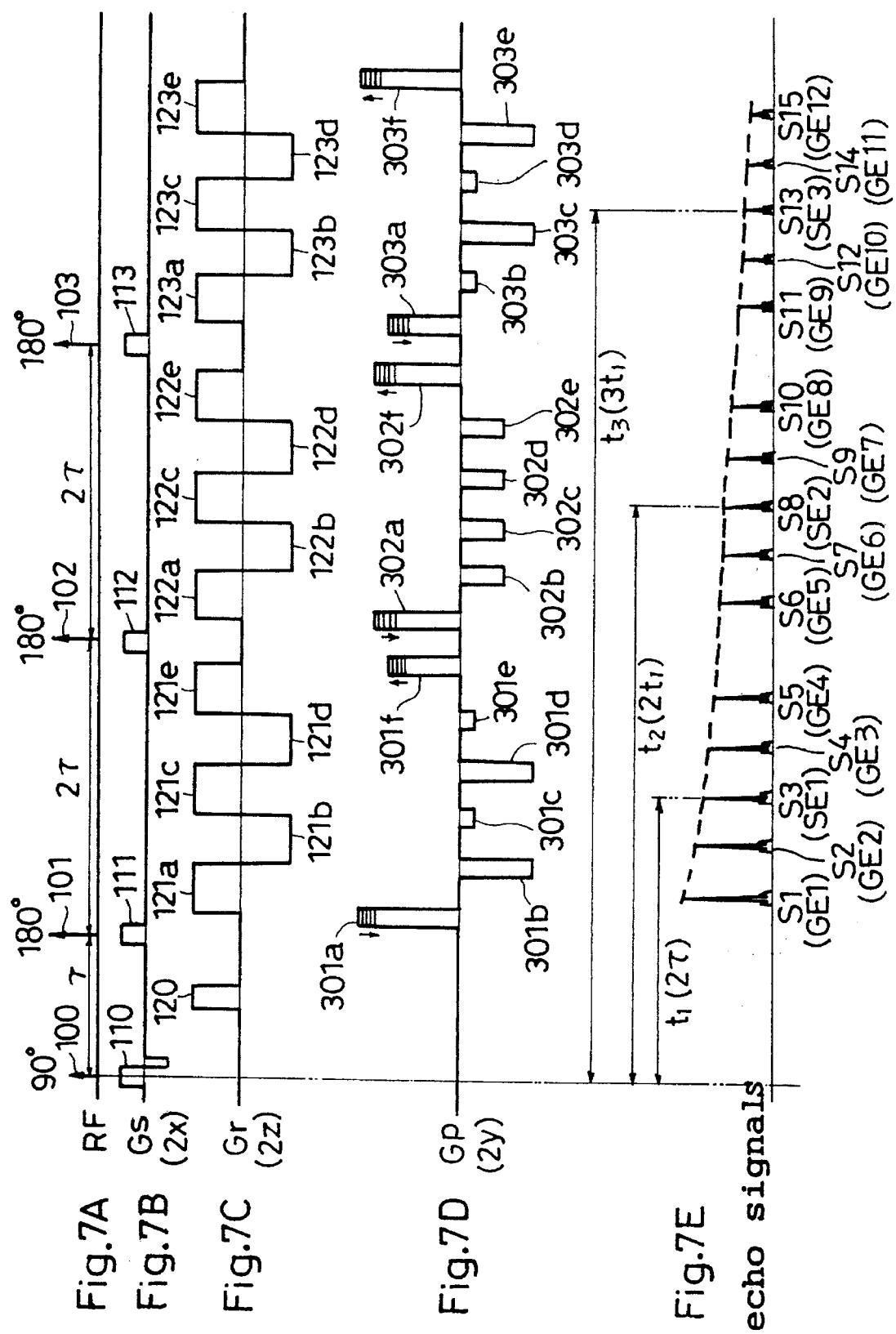

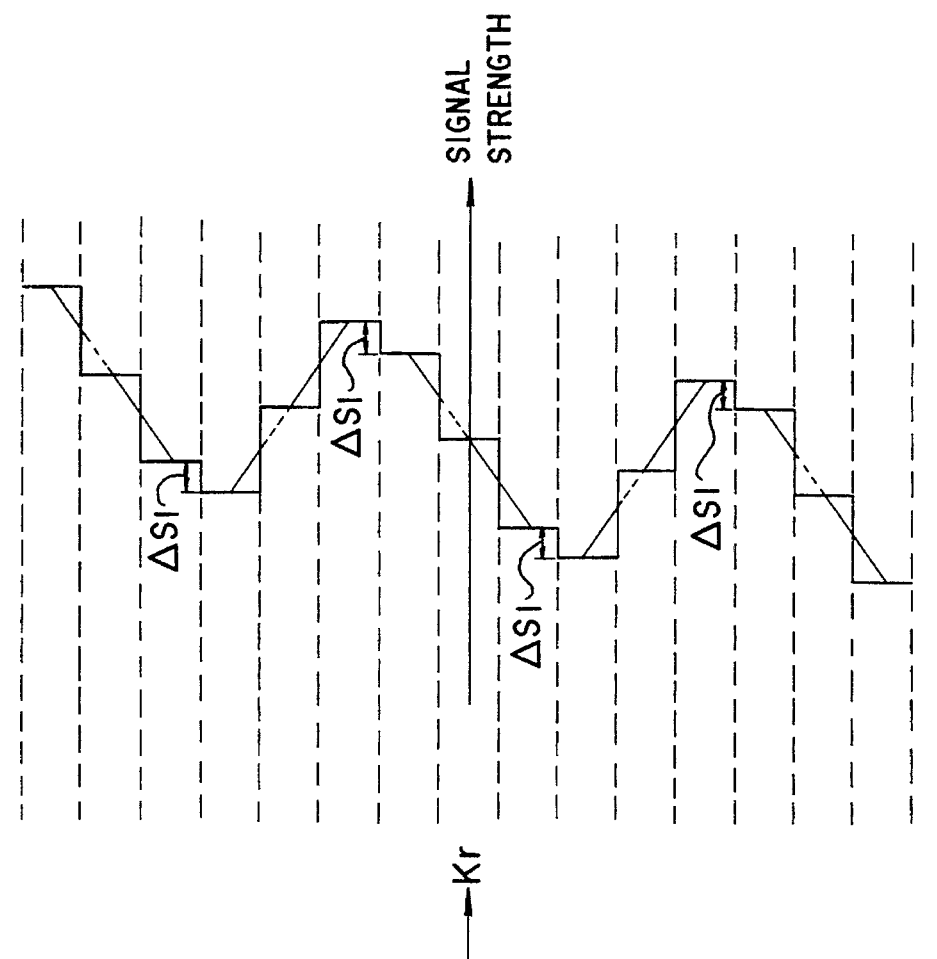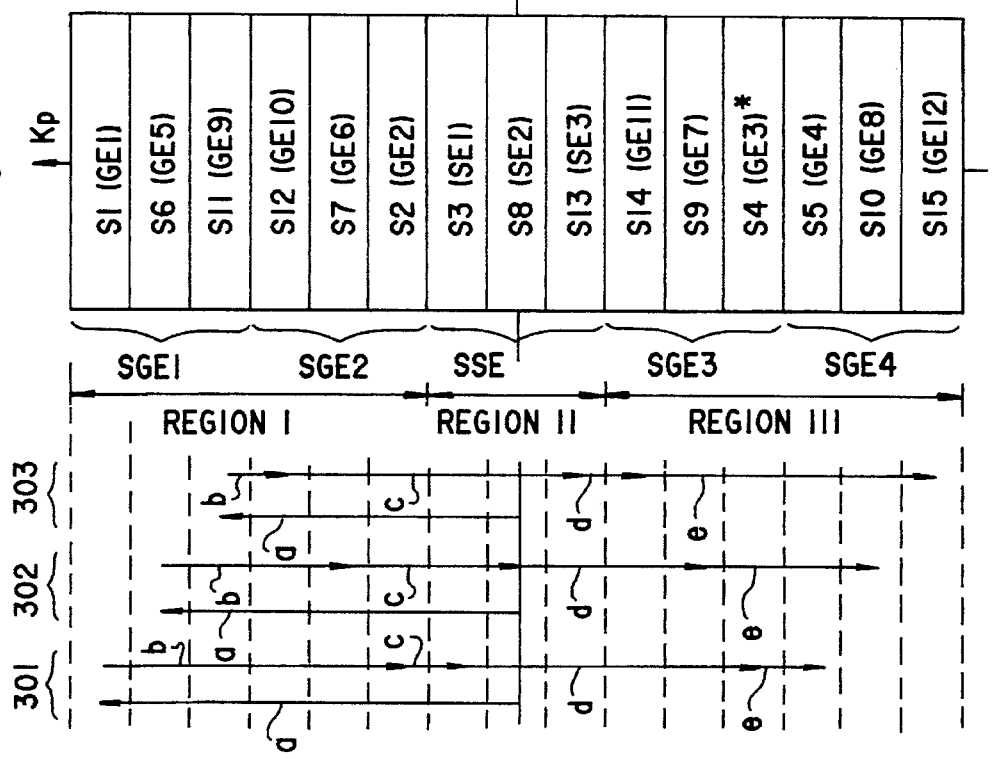

MR IMAGING APPARATUS

BACKGROUND OF THE INVENTION

(1) Field of the Invention

This invention relates to MR imaging apparatus using NMR (nuclear magnetic resonance), and more particularly to an MR imaging apparatus for effecting high-speed imaging based on GRASE (gradient and spin echo) technique.

(2) Description of the Related Art

Various MR imaging apparatus capable of high-speed imaging have been conceived heretofore. For example, an MR imaging apparatus is known which effects a pulse sequence for high-speed imaging called GRASE technique (U.S. Pat. No. 5,270,954, and K. Oshio and D. A. Feiberg "GRASE (Gradient and Spin Echo Imaging: A Novel Fast MRI Technique", Magnetic Resonance in Medicine 20, 344–349, 1991). The pulse sequence based on the GRASE technique is one combining the EPI (Echo Planar Imaging) technique, a type of high-speed imaging technique which generates gradient echo signals by switching the polarity of a gradient magnetic field, and the RARE (Rapid Acquisition with Relaxation Enhancement) which generates spin echo signals by using an excitation RF (Radio Frequency) pulse and refocus RF pulses.

The pulse sequence based on the GRASE technique in conventional practice will be described with reference to FIGS. 1A through 1E.

In this sequence, as shown in FIG. 1A, one excitation RF pulse 100 (also called 90° pulse since it rotates the spin phase of protons 90°) is applied, which is followed by a plurality of (three in this example) refocus RF pulses 101–103 (also called 180° pulses since they rotate the spin phase of protons 180°). Simultaneously with these RF pulses, as shown in FIG. 1B, pulses 110–113 are applied to form slice-selecting gradient fields Gs. Then, as shown in FIG. 1C, a pulse 120 is applied to form a dephasing gradient field Gr for disarraying the protons, which is followed by pulses 121–123 applied between the above RF pulses to form reading and frequency-encoding gradient fields Gr.

Further, as shown in FIG. 1C, each of these Gr pulses 121–123 is switched a plurality of times (four times in this example) between one 180° pulse and the next 180° pulse (101 and 102 or 102 and 103). This generates spin echo signals S3(SE1), S8(SE2) and S13(SE3) [at points of time corresponding to an interval between 90° pulse 100 and 180° pulse 101 multiplied by even numbers], as well as gradient echo signals S1(SE1), S2(GE2), S4(GE3), S5(GE4), S6(GE5), S7(GE6), S9(GE7), S10(GE8), S11(GE9), S12(GE10), S14(GE11) and S15(GE12).

As shown in FIG. 1D, pulses of phase-encoding gradient fields Gp are applied immediately before generation of the respective echo signals S1–S15. These Gp pulses are applied in amounts corresponding to phase encode amounts for causing data acquired from the echo signals S1–S15 to be arranged in a K space (also called a raw data space) as shown in FIG. 2A.

Specifically, the data acquired from spin echo signals SE1–SE3 are arranged in a middle region (low frequency region) II of the K space. The data acquired from gradient echo signals GE1, GE5, GE9, GE2, GE6 and GE10, and those acquired from gradient echo signals GE3, GE7, GE11, GE4, GE8 and GE12, are arranged in peripheral regions (high frequency regions) I and III of the K space, respectively. In each of the regions I, II and III, the data are arranged from top to bottom in the order of echo signal generation, i.e. from the positive high frequency region through the low frequency region to the negative high frequency region. The pulses of phase-encoding gradient fields Gp are applied in the amounts to realize the above arrangement.

To provide such phase encode amounts, as shown in FIGS. 1D and 2B, the pulse applied in the greatest amount is pulse 131a of phase encoding gradient field Gp which is applied immediately after the first 180° pulse 101 and immediately before the first gradient echo signal S1(GE1). As a result, the data acquired from the gradient echo signal S1(GE1) is placed in the uppermost position (positive region) in the K space. The pulses 131b–131e of phase-encoding gradient fields Gp immediately preceding the echo signals S2(GE2), S3(SE1), S4(GE3) and S5(GE4), respectively, have an opposite polarity to the gradient field pulse 131a. The pulses 131b–131e all have the same amplitude which is smaller than that of the gradient field pulse 131a. Consequently, the data acquired from echo signals S2, S3, S4 and S5 are equidistantly arranged in the K space downward from the position of the data acquired from signal S1 (see FIG. 2B).

The phase-encoding gradient field pulse 131f applied subsequently serves the rewinding purpose, i.e. for zero resetting phase encode amounts added up prior to application of the next 180° pulse 102. The phase-encoding gradient field pulse 132a applied after the second 180° pulse 102 has a slightly smaller amplitude than the gradient field pulse 131a. Consequently, the echo signal S6(GE5) has a phase encode amount to be disposed in the K space immediately below the data acquired from echo signal S1(GE1). The gradient field pulses 132b–132e immediately preceding the echo signals S7–S10, respectively, have the same amplitude and polarity as the above gradient field pulses 131b–131e. Consequently, the data acquired from echo signals S7(GE6), S8(SE2), S9(GE7) and S10(GE8) are arranged in the K space downward from the position of the data acquired from signal S6, at intervals corresponding to the intervals at which the data from echo signals S1, S2, S3, S4 and S5 are arranged. Thus, the data from echo signals S7, S8, S9 and S10 are arranged in the K space immediately below the data from signals S2, S3, S4 and S5, respectively. Subsequently, a rewinding gradient field pulse 132f is applied.

The phase-encoding gradient field pulse 133a applied after the third 180° pulse 103 has a still slightly smaller amplitude than the gradient field pulse 132a. The gradient field pulses 133b–133e have the same amplitude and polarity as the gradient field pulses 131b–131e (and gradient field pulses 132b–132e). Consequently, the data acquired from echo signals S11(GE9), S12(GE10), S13(SE3), S14(GE11) and S15(GE12) are arranged in the K space immediately below the data from signals S6, S7, S8, S9 and S10, respectively.

As described above, phase encode amounts are set so that data acquired from the spin echo signals free from phase errors due to non-uniformity of the static magnetic field and due to chemical shifts are arranged in the middle region II of the K space (the middle region II being a low frequency region having a substantial influence on the contrast of an image reconstructed by a Fourier transform of the K space). This provides the advantage that a blur is unlikely to occur to the reconstructed image, which is one type of artifacts caused by discontinuous phase encode amounts in the K space due to phase errors. Further, in the above sequence, the echo signals having the same place in the order of generation within the respective periods between the 180° pulses are grouped together (as SGE1, SGE2, SSE, SGE3 and SGE4 in FIG. 2A). This arrangement eliminates the phase errors at the boundaries between the echo signals grouped together (though the phase errors remain at the boundaries between the echo signal groups) to diminish the chance of a blur occurring to the image.

In the conventional pulse sequence described above, however, a striking difference ΔS in signal strength occurs at the boundaries between the groups (between SGE1 and SGE2, between SGE2 and SSE, between SSE and SGE3, and between SGE3 and SGE4) of data acquired from the grouped echo signals. That is, the echo signals S1–S15 have strengths as shown in FIG. 2C. This is due to the fact that, as shown in FIG. 1E, the echo signals S1–S2 gradually attenuate with time constant T2 and time constant T2* after the first 90° pulse 100 (in which time constant T2 represents a transverse relaxation time (also called spin-spin relaxation time) occurring with the spin echo signals, and time constant T2* represents a transverse relaxation time occurring with the gradient echo signals and involving a faster attenuation due to non-uniformity of the static magnetic field than time constant T2). Thus, echo signals S1–S15 have strengths diminishing in the order of generation thereof. The data acquired from echo signals S1–S15 are arranged in the K space as shown in FIG. 2A. As seen in the phase encoding direction (vertical direction) of the K space, the signal strength changes sharply at the boundary between the data of signal S11 and the data of signal S2 (i.e. the boundary between SGE1 and SGE2), the boundary between the data of signal S12 and the data of signal S3 (i.e. the boundary between SGE2 and SSE), the boundary between the data of signal S13 and the data of signal S4 (i.e. the boundary between SSE and SGE3), and the boundary between the data of signal S14 and the data of signal S5 (i.e. the boundary between SGE3 and SGE4). This results in a disadvantage that, when an image is reconstructed by a Fourier transform of the data arranged in the K space as above, artifacts will blur the reconstructed image.

SUMMARY OF THE INVENTION

The object of this invention is to provide an MR imaging apparatus which acquires data from echo signals and diminishes differences in signal strength between those data arranged adjacent each other in the K space, thereby to suppress image blurring artifacts effectively.

The above object is fulfilled, according to this invention, by an MR imaging apparatus using NMR phenomenon, comprising:

a main magnet for generating a uniform static magnetic field in an imaging space;

a first, a second and a third gradient field coils for generating three types of gradient field pulses (i.e. slice-selecting gradient field pulses, reading gradient field pulses and phase-encoding gradient field pulses) with magnetic strengths varying in three orthogonal directions in the imaging space;

a RF coil for emitting an excitation RF pulse and a plurality of refocus RF pulses and detecting echo signals;

a RF emitter for successively emitting the excitation RF pulse and the refocus RF pulses with predetermined timing through the RF coil;

a slice-selecting gradient field pulse generator for generating the slice-selecting gradient field pulses through the first gradient field coil for selecting slice planes, in timed relationship with the excitation RF pulse and the refocus RF pulses;

a reading gradient field pulse generator for generating, during each of periods between the refocus RF pulses, a plurality of gradient echo signals distributed across one of spin echo signals by switching polarity a plurality of times, and for generating the reading gradient field pulses through the second gradient field coil in timed relationship with the spin echo signals and the gradient echo signals;

a phase-encoding gradient field pulse generator for generating the phase-encoding gradient field pulses through the third gradient field coil immediately before generation of the echo signals, the phase-encoding gradient field pulses satisfying the following conditions:

(a) that the phase-encoding gradient field pulses have varied strengths to vary integrated phase encode amounts of the echo signals from a positive (or negative) value through zero to a negative (or positive) value according to an order of generation of the spin echo signals; and (b) that the phase-encoding gradient field pulses have varied strengths to vary an integrated phase encode amount of each group of those of the gradient echo signals having the same place in an order of generation thereof within the respective periods, in a direction reverse to a direction in which integrated phase encode amounts of the spin echo signals vary, and to give the integrated phase encode amounts of each group of the gradient echo signals greater absolute values than the integrated phase encode amounts of the spin echo signals; and a data processor for collecting data from the echo signals detected by the RF coil, and reconstructing a sectional image by arranging the data in a K space according to an integrated phase encode amount of each of the echo signal.

The main magnet forms a static magnetic field in an imaging space, and then the first gradient field coil applies a slice-selecting gradient field pulse to the imaging space to select a slice. Then, the RF emitter successively emits one excitation RF pulse and a plurality of refocus RF pulses successively. Spin echo signals free from phase errors due to non-uniformity of the static magnetic field formed by the main magnet or due to chemical shifts are generated during a period between the excitation RF pulse and the first refocus RF pulse and during periods corresponding to the above period multiplied by even numbers. Further, during each of the periods between the refocus RF pulses, the reading gradient field pulse generator switches the polarity of reading gradient field pulses a plurality of times through the second gradient field coil, to generate a plurality of gradient echo signals distributed across one of the spin echo signals.

Thus, each period between the refocus RF pulses includes a plurality of gradient echo signals distributed across one spin echo signal. These echo signals have signal strengths decreasing successively and substantially with time constants of transverse relaxation time.

The echo signals generated successively are subjected to phase encoding by the phase-encoding gradient field pulse generator generating phase-encoding gradient field pulses through the third gradient field coil, as follows. First, the amplitude of the phase-encoding gradient field pulses is varied to vary integrated phase encode amounts of the spin echo signals from a positive (or negative) value through zero to a negative (or positive) value according to an order of generation. In this way, the spin echo signals have integrated phase encode amounts successively decreasing (or increasing) in the order of generation. The data acquired from the spin echo signals are arranged in a positive direction of the K space in the order of signal generation (or in the opposite order thereto). Consequently, the K space has the spin echo signal data arranged therein, with signal strengths of the data decreasing (or increasing when arranged in the opposite order to the order of generation) in the positive direction of the K space. Since the integrated phase encode amounts are adjacent zero, the data acquired from the spin echo signals are arranged in a middle region of the K space which exerts a substantial influence on the contrast of a reconstructed image.

Next, the gradient echo signals are subjected to phase encoding as follows.

The strength of the phase-encoding gradient field pulses is varied to vary integrated phase encode arranged in the K space peripherally of the data from the spin echo signals. At boundaries in the K space between the group of data acquired from the spin echo signals (with increasing (or decreasing) signal strengths) and adjacent groups of data acquired from the gradient echo signals (with decreasing (or increasing) signal strengths), a diminished difference in signal strength occurs because the signal strength tending to increase and that tending to decrease (or the signal strength tending to decrease and that tending to increase) meet at these boundaries.

The echo signals phase-encoded as above are detected by the RF coil, and arranged in the K space according to the respective integrated phase encode amounts by the data processor. Then, an image is reconstructed by a two-dimensional Fourier transform. Image blurring artifacts are suppressed in the reconstructed image since a difference in signal strength is diminished (smoothed) at the boundaries between the group of data arranged in the middle region of the K space (i.e. the group of data acquired from the spin echo signals) and the data arranged peripherally thereof (the groups of data acquired from the gradient echo signals).

It is preferred that, in the apparatus according amounts of each group of gradient echo signals having the same place in an order of generation thereof within the respective periods between the refocus RF pulses, in an opposite direction to the direction in which the integrated phase encode amounts of the spin echo signals vary, and to give the integrated phase encode amounts of each group of gradient echo signals greater absolute values than the integrated phase encode amounts of the spin echo signals. Thus, phase encoding is effected in which the integrated phase encode amounts of each group of gradient echo signals vary in the opposite direction to the direction in which the integrated phase encode amounts of the spin echo signals vary. As a result, the data acquired from the gradient echo signals are arranged in a signal strength increasing order in the K space where the data from the spin echo signals are arranged in the signal strength decreasing order, and in a signal strength decreasing order where the data from the spin echo signals are arranged in the signal strength increasing order. Further, the integrated phase encode amounts of each group of gradient echo signals are given greater absolute values than the integrated phase encode amounts of the spin echo signals. As a result, the data acquired from the gradient echo signals are to this invention, the RF emitter is operable to control emission timing of an "n"th refocus RF pulse ("n" being a positive integer) to establish;

$$\{2(n-1)+1\}\tau$$

where emission of the excitation RF pulse is regarded as time origin, and $\tau$ is a point of time at which a first one of the refocus RF pulses is emitted.

Where the refocus RF pulses are emitted with the above timing, the periods of time to generation of the respective spin echo signals correspond to the period of time to generation of the first echo signal multiplied by integers. Thus, spurious echo signals due to imperfection of the refocus RF pulses are generated at the same points of time as the proper spin echo signals to suppress phase shift. In this way, the spurious echo signals may also be used as stimulated spin echo signals for image formation.

Preferably, the phase-encoding gradient field pulse generator is operable to generate a rewinding pulse of reversed polarity and having a strength corresponding to a preceding integrated phase encode amount, after a final one of the echo signals is generated within the each period.

The rewind pulse having the same integrated phase encode amount and reversed polarity allows only a new phase encoding to be carried out after eliminating the influence of the phase encoding effected for a preceding pulse period. As a result, the phase encoding becomes continuous in the K space with phase shift checked, to suppress blurring artifacts in a reconstructed image.

In another aspect of this invention, an MR imaging apparatus using NMR phenomenon is provided, which comprises:

a main magnet for generating a uniform static magnetic field in an imaging space;

a first, a second and a third gradient field coils for generating three types of gradient field pulses (i.e. slice-selecting gradient field pulses, reading gradient field pulses and phase-encoding gradient field pulses) with magnetic strengths varying in three orthogonal directions in the imaging space;

a RF coil for emitting an excitation RF pulse and a plurality of refocus RF pulses and detecting echo signals;

a RF emitter for successively emitting the excitation RF pulse and the refocus RF pulses with predetermined timing through the RF coil;

a slice-selecting gradient field pulse generator for generating the slice-selecting gradient field pulses through the first gradient field coil for selecting slice planes, in timed relationship with the excitation RF pulse and the refocus RF pulses;

a reading gradient field pulse generator for generating, during each of periods between the refocus RF pulses, a plurality of gradient echo signals distributed across one of spin echo signals by switching polarity a plurality of times, and for generating the reading gradient field pulses through the second gradient field coil in timed relationship with the spin echo signals and the gradient echo signals;

a phase-encoding gradient field pulse generator for generating the phase-encoding gradient field pulses through the third gradient field coil immediately before generation of the echo signals, the phase-encoding gradient field pulses satisfying the following conditions:

(a) that the phase-encoding gradient field pulses have varied strengths to vary integrated phase encode amounts of the echo signals from a positive (or negative) value through zero to a negative (or positive) value according to an order of generation of the spin echo signals; and (b) that the phase-encoding gradient field pulses have varied strengths to vary integrated phase encode amounts of each group of those of the gradient echo signals having the same place in an order of generation thereof within the periods, such that integrated phase encode amounts of the gradient echo signals vary in directions alternately reversed from a direction in which integrated phase encode amounts of the spin echo signals vary, as a period of time from the points at which the spin echo signals are generated prolongs from a group of the gradient echo signals having the shortest period, with absolute values becoming greater than those of the group of the gradient echo signals having the shortest period; and a data processor for collecting data from the echo signals detected by the RF coil, and reconstructing a sectional image by arranging the data in a K space according to an integrated phase encode amount of each of the echo signal.

According to this apparatus, the echo signals generated successively are subjected to phase encoding as follows.

First, the amplitude of the phase-encoding gradient field pulses is varied to vary integrated phase encode amounts of the spin echo signals from a positive (or negative) value through zero to a negative (or positive) value according to an order of generation. In this way, the spin echo signals have integrated phase encode amounts successively decreasing (or increasing) in the order of generation. The data acquired from the spin echo signals are arranged in a positive direction of the K space in the order of signal generation (or in the opposite order thereto). Consequently, the K space has the spin echo signal data arranged therein, with signal strengths of the data decreasing (or increasing when arranged in the opposite order to the order of generation) in the positive direction of the K space. Since the integrated phase encode amounts are adjacent zero, the data acquired from the spin echo signals are arranged in a middle region of the K space which exerts a substantial influence on the contrast of a reconstructed image.

Next, the gradient echo signals are subjected to phase encoding as follows.

The strength of the phase-encoding gradient field pulses is varied to vary integrated phase encode amounts of each group of gradient echo signals having the same place in the order of generation thereof within the periods between the refocus RF pulses, such that integrated phase encode amounts of the gradient echo signals vary in directions alternately reversed from a direction in which integrated phase encode amounts of the spin echo signals vary. This reversal takes place as a period of time from the points at which the spin echo signals are generated prolongs from a group of the gradient echo signals having the shortest period, with absolute values becoming greater than those of the group of the gradient echo signals having the shortest period. Thus, for each group of gradient echo signals having the same place in the order of generation thereof, the integrated phase encode amounts of the gradient echo signals vary in directions alternately reversed from the direction in which integrated phase encode amounts of the spin echo signals vary, as a period of time from the points of time within each period between the refocus RF pulses at which the spin echo signals are generated prolongs from a group of the gradient echo signals having the shortest period. As a result, the data acquired from the gradient echo signals are arranged in a signal strength increasing order in the K space where the data from the spin echo signals are arranged in the signal strength decreasing order, and in a signal strength decreasing order where the data from the spin echo signals are arranged in the signal strength increasing order. Further, the integrated phase encode amounts have absolute values becoming greater, with prolonged periods, than those of the group of the gradient echo signals having a short period. Thus, the group of data acquired from the group of gradient echo signals arranged in the peripheral regions have a tendency reverse to the signal strength decreasing or increasing tendency of adjacent groups of data.

Consequently, at boundaries in the K space between the group of data acquired from the spin echo signals (with increasing (or decreasing) signal strengths) and adjacent groups of data acquired from the gradient echo signals (with decreasing (or increasing) signal strengths), a diminished difference in signal strength occurs because the signal strength tending to increase and that tending to decrease (or the signal strength tending to decrease and that tending to increase) meet at these boundaries. Further, groups of data acquired from the gradient echo signals and having increasing (or decreasing) signal strengths are arranged peripherally of groups of data acquired from the gradient echo signals and having decreasing (or increasing) signal strengths. Consequently, at boundaries between the groups of data acquired from the gradient echo signals (with decreasing (or increasing) signal strengths) and peripheral groups of data acquired from the gradient echo signals (with increasing (or decreasing) signal strengths), a diminished difference in signal strength occurs because the signal strength tending to decrease and that tending to decrease (or the signal strength tending to increase and that tending to decrease) meet at these boundaries. In the K space, therefore, the signal strength is diminished not only at the boundaries between the group of data acquired from the spin echo signals and arranged in the middle region and adjacent groups of data acquired from the gradient echo signals, but also at the boundaries between the groups of data arranged peripherally which are acquired from the groups of gradient echo signals each having the same place in the order of generation.

The echo signals phase-encoded as above are detected by the RF coil, and arranged in the K space according to the respective integrated phase encode amounts by the data processor. Then, an image is reconstructed by a two-dimensional Fourier transform. Image blurring artifacts are suppressed in the reconstructed image since a difference in signal strength is diminished (smoothed) at the boundaries between the group of data arranged in the middle region of the K space (i.e. the group of data acquired from the spin echo signals) and the data arranged peripherally thereof (the groups of data acquired from the gradient echo signals), and at the boundaries between the latter and the data arranged peripherally thereof (the groups of data acquired from the gradient echo signals).

It is preferred that, in the apparatus according to this invention, the RF emitter is operable to control emission timing of an "n"th refocus RF pulse ("n" being a positive integer) to establish;

$$\{2(n-1)+1\}\tau$$

where emission of the excitation RF pulse is regarded as time origin, and $\tau$ is a point of time at which a first one of the refocus RF pulses is emitted.

Preferably, the phase-encoding gradient field pulse generator is operable to generate a rewinding pulse of reversed polarity and having a strength corresponding to a preceding integrated phase encode amount, after a final one of the echo signals is generated within the each period.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIGS. 1A through 1E are a time chart showing a pulse sequence according to the prior art;

FIGS. 2A through 2C are a schematic view showing a K space and signal strengths according to the prior art;

FIGS. 4A through 4E are a time chart showing a pulse sequence in a first embodiment of this invention;

FIGS. 5A through 5C are a schematic view showing a K space and signal strengths in the first embodiment;

FIGS. 7A through 7E are a time chart showing a pulse sequence in a second embodiment of this invention;

FIGS. 8A through 8C are a schematic view showing a K space and signal strengths in the second embodiment.

DETAILED DESCRIPTION OF THE PREFERRED EMBODIMENTS

Preferred embodiments of this invention will be described in detail hereinafter with reference to the drawings.

First Embodiment

Figure 3:
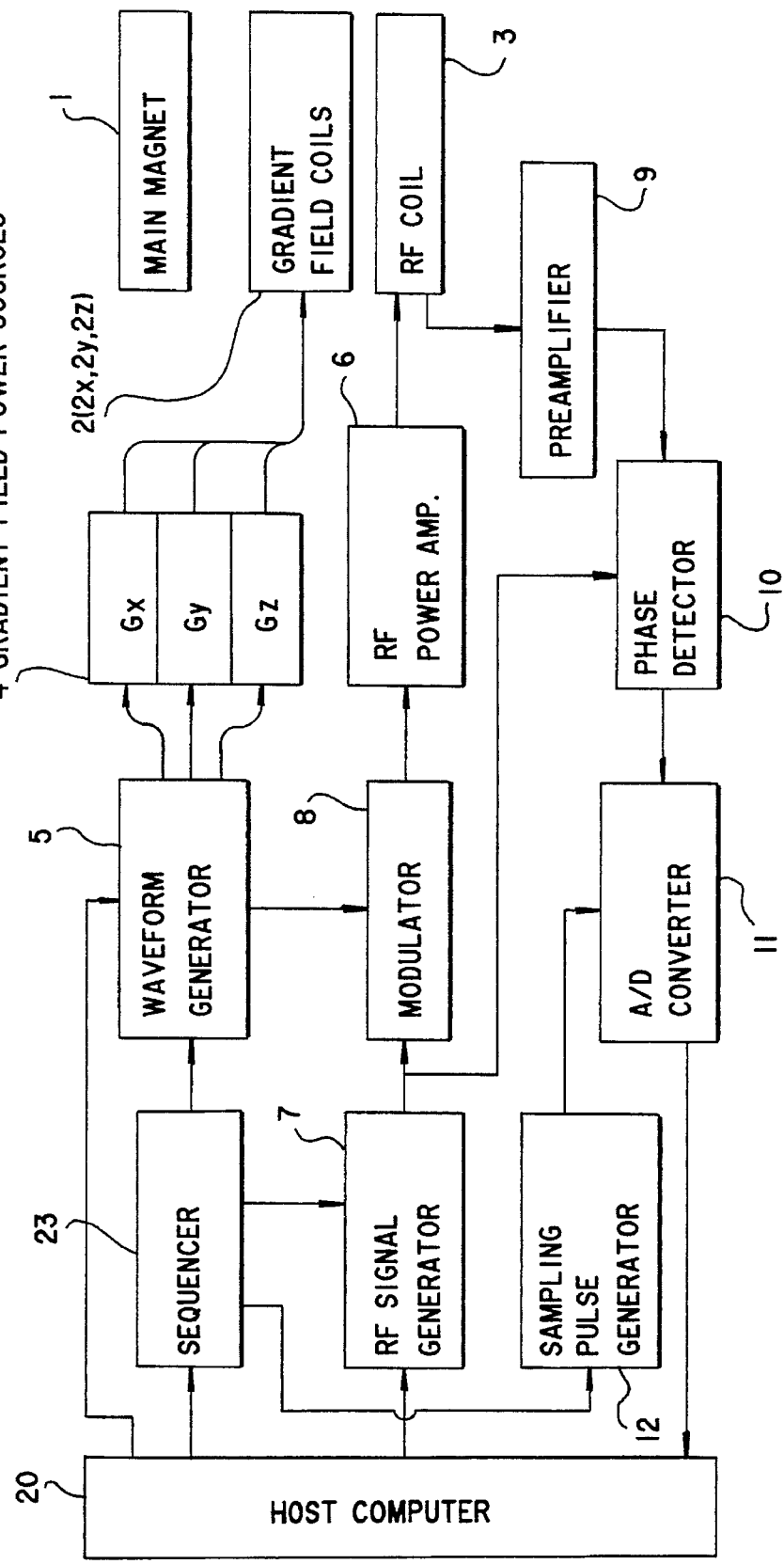
FIG. 3 is a block diagram of an MR imaging apparatus according to this invention.

The MR imaging apparatus shown in FIG. 3 will be described first. The apparatus includes a main magnet 1 for forming a static magnetic field, and three gradient field coils 2 (i.e. 2x, 2y and 2z) for superimposing gradient magnetic fields on the static magnetic field. The three gradient field coils 2x, 2y and 2z superimpose, on the uniform static field formed by the main magnet 1, pulses for three gradient fields Gs, Gp and Gr (i.e. a slice-selecting gradient field pulse, a phase-encoding gradient field pulse, and a reading gradient field pulse) each having a field strength varying in three orthogonal directions (X, Y and Z). An examinee (patient), not shown, is placed in a space where the static and gradient fields are formed, with a RF coil (radiofrequency coil) 3 attached to the examinee.

Gradient field power sources 4 are connected to the gradient field coils 2 to supply power for generating the gradient fields Gx, Gy and Gz. The gradient field power sources 4 receive waveform signals from a waveform generator 5 to control waveforms of the gradient fields Gx, Gy and Gz, The RF coil 3 receives a RF signal from a RF power amplifier 6 to irradiate the examinee with the RF signal. This RF signal results from an amplitude modulation effected by a modulator 8, according to a waveform received from the waveform generator 5, on a RF signal of a predetermined carrier frequency generated by a RF signal generator 7.

The RF coil 3 receives NMR signals generated in the examinee, and transmits these signals through a preamplifier 9 to a phase detector 10. The phase detector 10 detects phases of the signals received, using the RF signal from the RF signal generator 7 as a reference frequency. Results of the detection are outputted to an analog-to-digital (A/D) converter 11. The A/D converter 11 also receives sampling pulses from a sampling pulse generator 12 for use in converting the detection results into digital data. The digital data are given to a host computer 20.

The host computer 20 processes the data to reconstruct an image, and determines timing of an overall sequence through a sequencer 23. That is, the sequencer 23, under the control of the host computer 20, transmits timing signals to the waveform generator 5, RF signal generator 7 and sampling pulse generator 12 to determine timing of waveform signal output from the waveform generator 5, timing of RF signal generation by the RF signal generator 7, and timing of sampling pulse generation by the sampling pulse generator 12. Further, the host computer 20 transmits waveform information to the waveform generator 5 to control the waveform, strength and the like of the pulses for the gradient fields Gx, Gy and Gz, and to determine an envelope of the RF signal emitted from the RF coil 3 to the examinee. The host computer 51 also transmits a signal to the RF signal generator 7 to control the carrier frequency of the RF signal. Thus, the host computer 20 controls the overall pulse sequence based on the GRASE method.

The above MR imaging apparatus, under control of the computer 20 and sequencer 23, executes a pulse sequence as shown in FIGS. 4A–4E. The pulse sequence shown in FIGS. 4A–4E is based essentially on the GRASE method with a partial improvement.

First, one 90° pulse (excitation RF pulse) 100 is applied through the RF coil 3, and simultaneously a pulse 110 is applied through the gradient field coil 2x to form a slice-selecting gradient field Gs. Then, a 180° pulse (refocus RF pulse) 101 is applied upon lapse of time $\tau$ from application of the 90° pulse 110, and a 180° pulse (refocus RF pulse) 102 upon lapse of time $2\tau$ from the 180° pulse 101. In this way, 180° pulses 101, 102 and 103 are applied successively along with slice-selecting gradient field pulses 111, 112 and 113.

In this case, a first spin echo signal S3(SE1) is generated around a point of time delayed from the 180° pulse 101 by a period of time corresponding to the period of time $\tau$ between the 90° pulse 100 and 180° pulse 101. Here, the time taken from the 90° pulse 100 to the echo center of spin echo signal S3(SE1) (echo delay time $2\tau$) is regarded as time t1.

Assuming that the echo delay time from the 90° pulse 100 to the echo center is t1 as noted above, the first 180° pulse 101 is set to t=(½)t1= $\tau$, where the 90° pulse 100 is regarded as time origin (t=0). Thus, emission time of an "n"th 180° pulse ("n" being a positive integer) is set to $\{2(n-1)+1\}\tau$, That is, by setting emission times of 180° pulses 101, 102 and 103 to t= $\tau$, t= (3/2)t1=3$\tau$, and t= (5/2)t1= 5$\tau$, respectively, spin echo signals S3(SE1), S8(SE2) and S13(SE3) are generated at points of time t1, t2 and t3, respectively. Thus, the periods of time t2 and t3 from the 90° pulse 100 to generation of the second and subsequent spin echo signals S8(SE2) and S13(SE3) correspond to the period of time t1 from the 90° pulse 100 to generation of the first spin echo signal multiplied by integers, i.e. t2= 2t1 and t3= 3t1.

By controlling emission timing of the 180° pulses as above, spurious spin echo signals due to imperfection of the 180° pulses are generated at the same points of time as the proper spin echo signals to suppress phase shift. In this way, the spurious spin echo signals may also be used as stimulated spin echo signals for image formation.

A dephasing gradient pulse 120 (for disarraying the spin phase of protons) is applied through the gradient field coil 2z before the first 180° pulse 101. Subsequently, during the period between 180° pulses 101 and 102, the polarity of the pulses for forming gradient fields Gr is switched four times (121a to 121b, 121b to 121c, 121c to 121d and 121d to 121e), for example, to generate echo signals S1–S5 during this period. Similarly, the polarity of the pulses for forming gradient fields Gr is switched during the period between the second 180° pulse 102 and third 180° pulse 103 and after the third 180° pulse 103, each to generate five echo signals S6–S10 or S11–S15. The middle echo signals S3, S8 and S13 among these echo signals S1–S15 are spin echo signals SE1–SE3 free from phase errors due to non-uniformity of the static magnetic field formed by the main magnet 1 or due to chemical shifts. The other echo signals are gradient echo signals GE1–GE12. As shown in FIG. 4E, the echo signals S1–S15 have strengths diminishing in the order of generation thereof. The time constants for this attenuation are transverse relaxation times T2 and T2*. Specifically, the spin echo signals SE1–SE3 unaffected by the non-uniformity of the static magnetic field attenuate with the transverse relaxation time T2 (also called spin-spin relaxation time since an energy exchange takes place between the spins), while the gradient echo signals GE1–GE12 influenced by the non-uniformity of the static magnetic field attenuate with the transverse relaxation time T2* involving a faster attenuation due to the non-uniformity of the static magnetic field than time constant T2.

The phase-encoding gradient field pulses Gp are applied through the gradient field coil 2y to provide the respective echo signals S1–S15 with different integrated phase encode amounts.

Gp pulse 201a applied after the first 180° pulse 101 and before the echo signal S1 has positive polarity and the greatest amplitude. Consequently, as shown in FIG. 5A, the data acquired from the gradient echo signal S1(GE1) is placed in the uppermost (positive region) position in the vertical direction (phase-encoding direction) in a K space (see FIG. 5B). Gp pulse 201b applied before generation of the next echo signal S2 has negative polarity but has an amplitude to provide a positive integrated amount in combination with the Gp pulse 201a already applied. Consequently, the data acquired from the gradient echo signal S2(GE2) is placed in a position in the K space downwardly spaced from the gradient echo signal S1(GE1). Gp pulse 201c applied before generation of the next echo signal S3 has the greatest amplitude of negative polarity which provides a slightly negative integrated amount in combination with the phase-encoding amounts already applied. Consequently, the data acquired from the spin echo signal S3(SE1) is placed in a negative position in the K space downwardly remote from the data of gradient echo signal S2(GE2). Gp pulse 201d applied before generation of the next echo signal S4 has negative polarity and provides an integrated amount in combination with the phase encode amounts already applied, which is slightly smaller than the integrated amount at the point of time of the spin echo signal S3(SE1). Consequently, the data acquired from the gradient echo signal S4(GE3) is placed in the K space immediately below the data of spin echo signal S3(SE1). Gp pulse 201e applied before generation of the next echo signal S5 has negative polarity and the same amplitude as the Gp pulse 201b applied to the gradient echo signal S2(GE2). Consequently, the data acquired from the gradient echo signal S5(GE4) is placed in the K space downwardly spaced from the gradient echo signal S4(GE3). Then, the next 180° pulse 102 is preceded by Gp pulse 201f of reversed polarity and having an amplitude corresponding to an integrated amount of the phase-encoding gradient field pulses Gp applied so far. Thus, the phase encoding effected up to this point is initialized to zero. This Gp pulse 201f is called a rewind pulse which eliminates influences of the phase encoding already effected, to assure accuracy of subsequent phase encoding.

This suppresses phase shifts to provide continuous phase-encoding data in the K space, thereby to avoid blurring artifacts appearing in a reconstructed image.

Gp pulse 202a applied after the second 180° pulse 102 and before the echo signal S6 has positive polarity and a slightly smaller amplitude than Gp pulse 201a applied to the gradient echo signal S1(GE1). Consequently, the data acquired from the gradient echo signal S6(GE5) is placed in a position in the K space immediately below the gradient echo signal S1(GE1). Gp pulse 202b applied before generation of the next echo signal S7 has negative polarity and the same amplitude as Gp pulse 201b already applied. This amplitude provides a positive integrated amount in combination with Gp pulse 202a already applied. With the same amplitude as Gp pulse 201b, the gradient echo signal S7(GE6) is placed in a position in the K space downwardly spaced from the gradient echo signal S6(GE5) by an amount corresponding to the vertical spacing between the gradient echo signals S1(GE1) and S2(GE2). Similarly, the gradient echo signals S8–S10 have, applied thereto, Gp pulses 202c, 202d and 202e which have the same amplitude as Gp pulse 201b already applied, i.e. the same amplitude as Gp pulse 202b applied to the gradient echo signal S7(GE6). The resulting data are arranged in the K space to have the same spacing as the gradient echo signals S6(GE5) and S7(GE6), respectively. Then, a rewind pulse 202f is applied as before.

Gp pulse 203a is applied after the third 180° pulse 103 and before the echo signal S11, which has positive polarity and a slightly smaller amplitude than Gp pulse 202a applied to the gradient echo signal S6(GE5). Consequently, the data acquired from the gradient echo signal S11(GE9) is placed in a position in the K space immediately below the gradient echo signal S6(GE5). Gp pulse 203b applied before generation of the next echo signal S12 has the same amplitude as Gp pulse 201b already applied. The data acquired from the gradient echo signal S12(GE10) is placed in a position in the K space downwardly spaced from the gradient echo signal S11(GE9) by an amount corresponding to the spacing between the gradient echo signals S1(GE1) and S2(GE2). That is to say immediately below the gradient echo signal S7(GE6). Gp pulse 203c applied before generation of the next echo signal S13 has negative polarity and the same amplitude as the Gp pulse 201d already applied. Consequently, the data acquired from the spin echo signal S13(SE3) is placed in a position in the K space downwardly spaced from the gradient echo signal S12(GE10) by an amount corresponding to the spacing between the spin echo signal S3(SE1) and gradient echo signal S4(GE3). That is to say immediately below the gradient echo signal S12(GE10). Gp pulse 203d applied before generation of the next echo signal S14 has negative polarity and the same amplitude as the Gp pulse 201c already applied. Consequently, the data acquired from the gradient echo signal S14(GE11) is placed in a position in the K space downwardly spaced from the spin echo signal S13(SE3) by an amount corresponding to the spacing between the gradient echo signal S2(GE2) and spin echo signal S3(SE1). That is to say immediately below the gradient echo signal S9(GE7). Gp pulse 203e applied before generation of the next echo signal S15 has the same amplitude as the Gp pulse 203b already applied. Consequently, the data acquired from the gradient echo signal S15(GE12) is placed in the lowermost position in the K space which is downwardly spaced from the gradient echo signal S14(GE11) by an amount corresponding to the spacing between the gradient echo signals S11(GE9) and S12(GE10). That is to say immediately below the gradient echo signal S10(GE8). Then, a rewind pulse 203f is applied as before.

Figure 6:
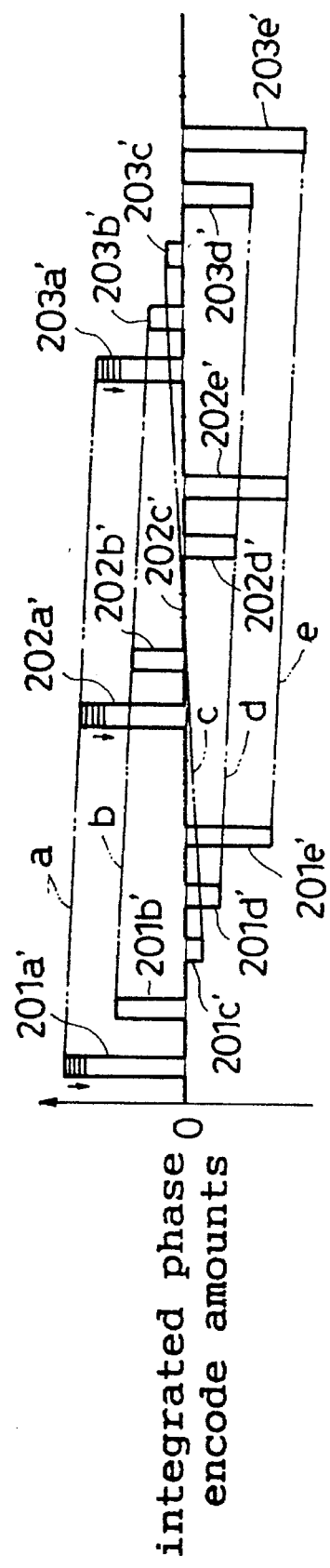
FIG. 6 is a schematic view showing integrated phase encode amounts in the first embodiment.

FIG. 6 schematically shows the integrated phase encode amounts provided as above. In this figure, the integrated amount for each Gp pulse is shown with an apostrophe (') attached to its reference sign. Integrated amounts 201c', 202c' and 203c' of phase encoding applied to the respective spin echo signals are set to vary successively from negative to positive through zero (as at reference "c"). Consequently, the data acquired from the spin echo signals SE1–SE3 are arranged in the middle region II of the K space in the order reverse to the order of their generation. Integrated amounts 201a'–203a', 201b'–203b', 201 d'–203d' and 201e'–203e' of phase encoding applied to the respective gradient echo signals are set to vary in the opposite direction to the variation of the integrated phase encode amounts given to the spin echo signals (as at references "a", "b", "d" and "e"). Consequently, the data acquired from the gradient echo signals GE1–GE12 are arranged the K space in the order of generation. The integrated phase encode amounts thereof have greater absolute values than those of the spin echo signals. The data acquired from the gradient echo signals GE1–GE12 are therefore arranged in the K space peripherally of those acquired from the spin echo signals.

The phase encoding effected for the respective echo signals as above results in the data arrangement as shown in FIG. 5A. Specifically, the group of spin echo signals SSE is arranged in the middle, low frequency region II of the K space. in the order of S13(SE3), S8(SE2) and S3(SE1) [downward in the K space] which is reverse to the order of signal generation. As for the gradient echo signals, those having the same place in the order of generation during the respective periods between the 180° pulses 101–103 are banded together into gradient echo signal groups (SGE1, SGE2, SGE3 and SGE4) and arranged in the order of generation within each group. The gradient echo signal groups SGE1 and SGE2 are arranged in the peripheral, high frequency region I of the K space, and the gradient echo signal groups SGE3 and SGE4 in the peripheral, high frequency region III.

FIG. 5C shows signal strengths of the data acquired from the echo signals and arranged in the K space as described above. The strengths of echo signals S1–S15 diminish with time constants T2 and T2* as noted hereinbefore. In each of the gradient echo signal groups SGE1–SGE4 in which the signals are arranged in the order of generation, therefore, the signal strengths all tend downward (as shown in two-dot-and-dash lines) when Kp-axis is seen as a horizontal axis. In the spin echo signal group SSE, on the other hand, the signal strengths show an upward tendency since the spin echo signals are arranged in the order reverse to their generation. Consequently, a difference $\Delta S1$ in signal strength at the boundaries between the spin echo signal group SSE and gradient echo signal groups SGE2 and SGE3 adjacent thereto is smaller than a difference $\Delta S$ in signal strength at the boundaries between the gradient echo signal groups SGE1 and SGE2 and between the gradient echo signal groups SGE3 and SGE4. Since the signal strength varies smoothly adjacent the middle region which exerts a substantial influence on an image reconstructed by a two-dimensional Fourier transform of the K space, the reconstructed image has excellent quality with suppression of image blurring artifacts.

In the above embodiment, an image is reconstructed by using the data acquired from 15 echo signals. The described sequence may be repeated to reconstruct an image based on data acquired from echo signals the number of which is a multiple of 15. In this case, data may be collected and arranged in the K space in an amount corresponding to the number of lines which is the multiple of 15. This is achieved by varying the first phase-encoding gradient field pulse in each pulse period to vary the phase encode amount little by little for each pulse sequence.

Second Embodiment

This embodiment employs a varied method of applying the pulses of phase-encoding gradient fields Gp in the pulse sequence in the foregoing embodiment. Thus, only the pertinent portion will particularly be described hereinafter.

Reference is made to FIGS. 7A through 7E. Gp pulse 301a applied after the first 180° pulse 101 and before the echo signal S1 has positive polarity and the greatest amplitude. Consequently, as shown in FIG. 8A, the data acquired from the gradient echo signal S1(GE1) is placed in the uppermost (positive side) position in the vertical direction (phase-encoding direction) in the K space. Gp pulse 301b applied before generation of the next echo signal S2 has negative polarity but has an amplitude to provide a positive integrated amount in combination with the Gp pulse 301a already applied. Consequently, the data acquired from the gradient echo signal S2(GE2) is placed in a position in the K space downwardly remote from the gradient echo signal S1(GE1). Gp pulse 301c applied before generation of the next echo signal S3 has negative polarity and a small amplitude which provides a slightly positive integrated amount in combination with the phase-encoding amounts already applied. Consequently, the data acquired from the spin echo signal S3(SE1) is placed in a negative position in the K space immediately below the data of gradient echo signal S2(GE2). Gp pulse 301d applied before generation of the next echo signal S4 has the same amplitude as the Gp pulse 301b applied to the gradient echo signal S2(GE2). Consequently, the data acquired from the gradient echo signal S4(GE3) is placed in the K space downwardly remote from the data of spin echo signal S3(SE1). Gp pulse 301e applied before generation of the next echo signal S5 has negative polarity and the same amplitude as the Gp pulse 301c applied to the spin echo signal S3(SE1). Consequently, the data acquired from the gradient echo signal S5(GE4) is placed in the K space immediately below the gradient echo signal S4(GE3). Then, a rewind pulse 301f is applied before the next 180° pulse 102.

Gp pulse 302a applied after the second 180° pulse 102 and before the echo signal S6 has positive polarity and a slightly smaller amplitude than Gp pulse 301a applied to the gradient echo signal S1(GE1). Consequently, the data acquired from the gradient echo signal S6(GE5) is placed in a position in K space immediately below the gradient echo signal S1(GE1). Gp pulse 302b applied before generation of the next echo signal S7 has negative polarity and an amplitude providing a positive integrated amount in combination with Gp pulse 302a already applied. Consequently, the gradient echo signal S7(GE6) is placed in a position in the K space downwardly remote from the gradient echo signal S6(GE5). Similarly, the gradient echo signals S8–S10 have, applied thereto, Gp pulses 302c, 302d and 302e which have the same amplitude as Gp pulse 302b applied to the gradient echo signal S7(GE6). The resulting data are arranged in the K space to have the same spacing as the gradient echo signals S6(GE5) and S7(GE6), respectively. Then, a rewind pulse 302f is applied as before.

Gp pulse 303a is applied after the third 180° pulse 103 and before the echo signal S11, which has positive polarity and a slightly smaller amplitude than Gp pulse 302a applied to the gradient echo signal S6(GE5). Consequently, the data acquired from the gradient echo signal S11(GE9) is placed in a position in K space immediately below the gradient echo signal S6(GE5). Gp pulse 303b applied before generation of the next echo signal S12 has the same amplitude as Gp pulse 301c already applied to the spin echo signal S3(SE1)). The data acquired from the gradient echo signal S12(GE10) is placed in a position in the K space downwardly spaced from the gradient echo signal S11(GE9) by an amount corresponding to the spacing between the gradient echo signals S12(GE10) and spin echo signal S3(SE1). That is to say immediately below the gradient echo signal S11(GE9). Gp pulse 303c applied before generation of the next echo signal S13 has negative polarity and the same amplitude as the Gp pulse 301b already applied. Consequently, the data acquired from the spin echo signal S13(SE3) is placed in a position in the K space downwardly spaced from the gradient echo signal S12(GE10) by an amount corresponding to the spacing between the gradient echo signals S1(SE2) and S2(GE2). Gp pulse 303d applied before generation of the next echo signal S14 has negative polarity and the same amplitude as the Gp pulse 303b already applied. Consequently, the data acquired from the gradient echo signal S14(GE11) is placed in a position in the K space immediately below the spin echo signal S13(SE3). Gp pulse 303e applied before generation of the next echo signal S15 has the same amplitude as the Gp pulse 303c already applied. Consequently, the data acquired from the gradient echo signal S15(GE12) is placed in the lowermost position in the K space which is downwardly spaced from the gradient echo signal S14(GE11) by an amount corresponding to the spacing between the gradient echo signal S12(GE10) and spin echo signal S13(SE3). That is to say immediately below the gradient echo signal S10(GE8). Then, a rewind pulse 303f is applied as before.

Figure 9:
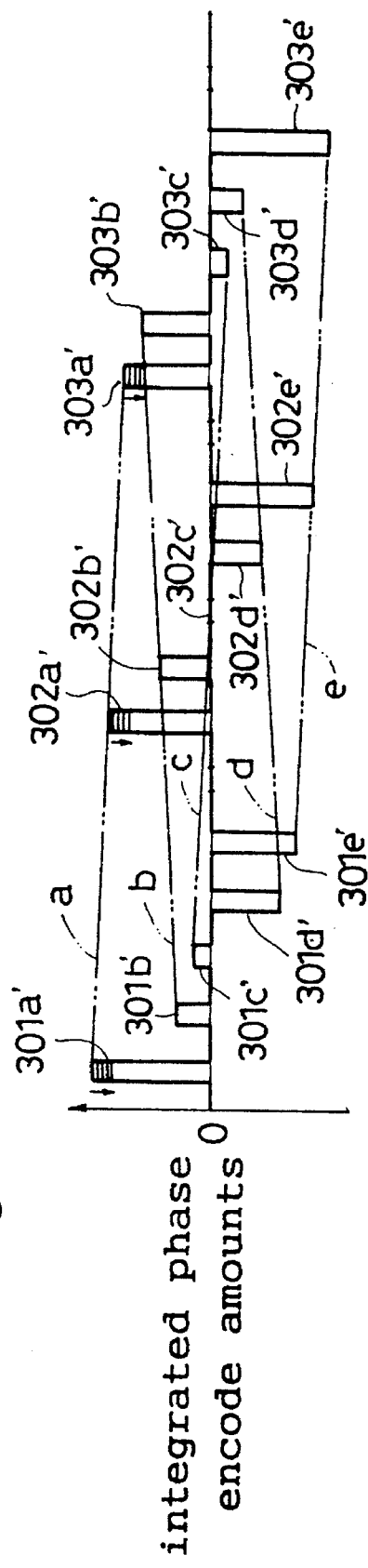
FIG. 9 is a schematic view showing integrated phase encode amounts in the second embodiment.

FIG. 9 schematically shows the integrated phase encode amounts provided as above. In this figure, the integrated amount for each Gp pulse is shown with an apostrophe (') attached to its reference sign. Integrated amounts 301c', 302c' and 303c' of phase encoding applied to the respective spin echo signals are set to vary successively from positive to negative through zero (as at reference "c"). Consequently, the data acquired from the spin echo signals SE1–SE3 are arranged in the order of generation in the middle region II of the K space. Integrated amounts 301a'– 303a', 301b'–303b', 301d'–303d' and 301e'–303e' of phase encoding applied to the respective gradient echo signals are set to vary in directions alternately reversed from the direction of variation of the integrated phase encode amounts applied to the spin echo signals (references "b" and "d" in the opposite direction; references "a" and "e" in the same direction). The above reversal takes place as the period of time from the points at which the spin echo signals are generated prolongs from the shortest period for the gradient echo signal groups (SGE2 and SGE3). Consequently, the data acquired from the gradient echo signal groups SGE2 and SGE3 are arranged in the K space in the order reverse to the order of generation. The data acquired from the gradient echo signal groups SGE1 and SGE4 are arranged in the K space in the order of generation. The integrated phase encode amounts of the gradient echo signals have greater absolute values than those of the spin echo signals. The data acquired from the gradient echo signal groups SGE1–SGE4 are therefore arranged in the K space peripherally of those acquired from the spin echo signals.

The phase encoding effected for the respective echo signals as above results in the data arrangement as shown in FIG. 8A. Specifically, the group of spin echo signals SSE is arranged in the middle, low frequency region II of the K space. in the order of S3(SE1), S8(SE2) and S13(SE3) [downward in the K space] which is the order of signal generation. As for the gradient echo signals, those having the same place in the order of generation during the respective periods between the 180° pulses 101–103 are banded together into gradient echo signal groups (SGE1, SGE2, SGE3 and SGE4). The signals in the gradient echo signal groups SGE1 and SGE4 are arranged in the order of generation within each group. The signals in the gradient echo signal groups SGE2 and SGE3 are arranged in the order reverse to the order of generation within each group. The gradient echo signal groups SGE1 and SGE2 are arranged in the peripheral, high frequency region I of the K space, and the gradient echo signal groups SGE3 and SGE4 in the peripheral, high frequency region III.

FIG. 8C shows signal strengths of the data acquired from the echo signals and arranged in the K space as described above. The strengths of echo signals S1–S15 diminish with time constants T2 and T2* as noted hereinbefore. In each of the spin echo signal group SSE and gradient echo signal groups SGE1 and SGE4 in which the signals are arranged in the order of generation, therefore, the signal strengths tend downward (as shown in two-dot-and-dash lines) when Kp-axis is seen as a horizontal axis. In the gradient echo signal groups SGE2 and SGE3, on the other hand, the signal strengths show an upward tendency since the gradient echo signals are arranged in the order reverse to their generation. Consequently, the difference ΔS1 in signal strength occurs at the boundaries between the spin echo signal group SSE and gradient echo signal groups SGE2 and SGE3 adjacent thereto, and at the boundaries between the gradient echo signal groups SGE2, SGE3 and the peripheral gradient echo signal groups SGE1, SGE4. That is, a diminished difference in signal strength is secured for all of the boundaries between adjacent echo signal groups. As a result, an image reconstructed by a two-dimensional Fourier transform of the K space has excellent quality with suppression of image blurring artifacts. In the preceding, first embodiment, the difference in signal strength is diminished only for the boundaries between the echo signal groups adjacent the middle of the K space. In the second embodiment, the difference in signal strength is diminished for all of the boundaries between the echo signal groups, to promote still further the effect of suppressing the image blurring artifacts, thereby assuring a reconstructed image of excellent quality.

In the first embodiment (and second embodiment), the pulses 201a (301a), 202a (302a) and 203a (303a) for the phase-encoding gradient fields Gp have positive polarity and successively diminishing amplitude. Alternatively, these pulses may have negative polarity and successively diminishing amplitude, with all the other Gp pulses having a polarity opposite thereto. This will result in a data arrangement in the K space vertically reversed from what is shown in FIG. 5A (or FIG. 8A).

In the first and second embodiments described above, one 90° pulse (excitation RF pulse) is followed by three 180° pulses (refocus RF pulses), and the polarity of the gradient field pulses is switched four times during each period between the 180° pulses, to generate a total of 15 echo signals. An additional 180° pulse or pulses may be applied after the above 180° pulses to obtain 20 or 25 echo signals.

While, in the first and second embodiments, the polarity of the gradient field pulses is switched four times during each period between the 180° pulses, this may be increased to six or eight times. Then, seven or nine echo signals are obtained during each period between the 180° pulses (with only the middle echo signal acting as a spin echo signal, and the others as gradient echo signals).

The present invention may be embodied in other specific forms without departing from the spirit or essential attributes thereof and, accordingly, reference should be made to the appended claims, rather than to the foregoing specification, as indicating the scope of the invention.

What is claimed is:

1. An MR imaging apparatus using NMR phenomenon, comprising:

a main magnet for generating a uniform static magnetic field in an imaging space;

a first, a second and a third gradient field coils for generating three types of gradient field pulses, said three types of gradient field pulses comprising, slice-selecting gradient field pulses, reading gradient field pulses, and phase-encoding gradient field pulses, with magnetic strengths varying in three orthogonal directions in said imaging space;

an RF coil for emitting an excitation RF pulse and a plurality of refocus RF pulses and detecting echo signals;

RF emitting means for successively emitting said excitation RF pulse and said refocus RF pulses with predetermined timing through said RF coil;

slice-selecting gradient field pulse generating means for generating said slice-selecting gradient field pulses through said first gradient field coil for selecting slice planes, in timed relationship with said excitation RF pulse and said refocus RF pulses;

reading gradient field pulse generating means for generating, during each of periods between said refocus RF pulses, a plurality of gradient echo signals distributed across one of spin echo signals by switching polarity a plurality of times, and for generating said reading gradient field pulses through said second gradient field coil in timed relationship with said spin echo signals and said gradient echo signals;

phase-encoding gradient field pulse generating means for generating said phase-encoding gradient field pulses through said third gradient field coil immediately before generation of said echo signals, said phase-encoding gradient field pulses satisfying the following conditions:

(a) that said phase-encoding gradient field pulses have varied strengths to vary integrated phase encode amounts of said echo signals form a positive or negative value through zero to a negative or positive value according to an order of generation of said spin echo signals; and (b) that said phase-encoding gradient field pulses have varied strengths to vary integrated phase encode amounts of each group of those of said gradient echo signals having the same place in an order of generation thereof within said periods, in a direction reverse to a direction in which integrated phase encode amounts of said spin echo signals vary, and to give said integrated phase encode amounts of each group of said gradient echo signals greater absolute values than said integrated phase encode amounts of said spin echo signals; and data processing means for collecting data from said echo signals detected by said RF coil, and reconstructing a sectional image by arranging said data in a K space according to an integrated phase encode amount of each of said echo signal.

2. An apparatus as defined in claim 1, wherein said RF emitting means is operable to control emission timing of an "n"th refocus RF pulse, "n" being a positive integer, to establish;

$$\{2(n-1)+1\}\tau$$

where emission of said excitation RF pulse is regarded as time origin, and $\tau$ is a point of time at which a first one of said refocus RF pulses is emitted.

3. An apparatus as defined in claim 1, wherein said phase-encoding gradient field pulse generating means is operable to generate a rewinding pulse of reversed polarity and having a strength corresponding to a preceding integrated phase encode amount, after a final one of said echo signals is generated within said each period.

4. An MR imaging apparatus using NMR phenomenon, comprising:

a main magnet for generating a uniform static magnetic field in an imaging space;

a first, a second and a third gradient field coils for generating three types of gradient field pulses, said three types of gradient field pulses comprising slice-selecting gradient field pulses, reading gradient field pulses, and phase-encoding gradient field pulses, with magnetic strengths varying in three orthogonal directions in said imaging space;

a RF coil for emitting an excitation RF pulse and a plurality of refocus RF pulses and detecting echo signals;

RF emitting means for successively emitting said excitation RF pulse and said refocus RF pulses with predetermined timing through said RF coil;

slice-selecting gradient field pulse generating means for generating said slice-selecting gradient field pulses through said first gradient field coil for selecting slice planes, in timed relationship with said excitation RF pulse and said refocus RF pulses;

reading gradient field pulse generating means for generating, during each of periods between said refocus RF pulses, a plurality of gradient echo signals distributed across one of spin echo signals by switching polarity a plurality of times, and for generating said reading gradient field pulses through said second gradient field coil in timed relationship with said spin echo signals and said gradient echo signals;

phase-encoding gradient field pulse generating means for generating said phase-encoding gradient field pulses through said third gradient field coil immediately before generation of said echo signals, said phase-encoding gradient field pulses satisfying the following conditions:

(a) that said phase-encoding gradient field pulses have varied strengths to vary integrated phase encode amounts of said echo signals from a positive or negative value through zero to a negative or positive value according to an order of generation of said spin echo signals; and (b) that said phase-encoding gradient field pulses have varied strengths to vary integrated phase encode amounts of each group of those of said gradient echo signals having the same place in an order of generation thereof within said periods, such that integrated phase encode amounts of said gradient echo signals vary in directions alternately reversed from a direction in which integrated phase encode amounts of said spin echo signals vary, as a period of time from the points at which said spin echo signals are generated prolongs from a group of said gradient echo signals having the shortest period, with absolute values becoming greater than those of said group of said gradient echo signals having the shortest period; and data processing means for collecting data from said echo signals detected by said RF coil, and reconstructing a sectional image by arranging said data in a K space according to an integrated phase encode amount of each of said echo signal.

5. An apparatus as defined in claim 4, wherein said RF emitting means is operable to control emission timing of an "n"th refocus RF pulse, "n" being a positive integer, to establish;

$$\{2(n-1)+1\}\tau$$

where emission of said excitation RF pulse is regarded as time origin, and $\tau$ is a point of time at which a first one of said refocus RF pulses is emitted.

6. An apparatus as defined in claim 4, wherein said phase-encoding gradient field pulse generating means is operable to generate a rewinding pulse of reversed polarity and having a strength corresponding to a preceding integrated phase encode amount, after a final one of said echo signals is generated within said each period.

* * * * *